United States Patent [19]
Chand et al.

[11] Patent Number: 5,629,233
[45] Date of Patent: May 13, 1997

[54] METHOD OF MAKING III/V SEMICONDUCTOR LASERS

[75] Inventors: Naresh Chand, Berkeley Heights; Sung-Nee G. Chu, Murray Hill, both of N.J.; Alexei V. Syrbu, Chisinau, Rep. of Moldova

[73] Assignee: Lucent Technologies Inc., Murray Hill, N.J.

[21] Appl. No.: 627,562

[22] Filed: Apr. 4, 1996

[51] Int. Cl.$^6$ .................................... H01L 21/784
[52] U.S. Cl. ............................................... 438/33
[58] Field of Search ........................ 437/129, 226; 148/DIG. 28, DIG. 95

[56] References Cited

U.S. PATENT DOCUMENTS

| | | | |
|---|---|---|---|
| 4,883,771 | 11/1989 | Kumabe et al. | 437/129 |
| 4,904,617 | 2/1990 | Muschke | 437/129 |
| 4,997,793 | 3/1991 | McClurg | 437/226 |
| 5,314,844 | 5/1994 | Imamura | 148/DIG. 28 |
| 5,393,707 | 2/1995 | Canning | 437/226 |
| 5,418,190 | 5/1995 | Cholewa et al. | 437/129 |

FOREIGN PATENT DOCUMENTS

| 0123086 | 7/1985 | Japan | 437/129 |
|---|---|---|---|

*Primary Examiner*—Tuan H. Nguyen
*Attorney, Agent, or Firm*—Eugen E. Pacher

[57] ABSTRACT

The disclosed novel method of making III/V semiconductor lasers involves cleaving of the wafer along predetermined cleavage planes. A cleavage plane is defined by means of aligned non-continuous depressions. The depressions are spaced from the laser contact regions, and typically are V-grooves produced by photolithography and anisotropic etching. A further surface feature, typically a precisely positioned scribe mark, facilitates cleavage initiation. When carried out in vacuum the novel method can provide high quality, accurately positioned cleavage surfaces, and consequently can facilitate increased yield of high power lasers.

8 Claims, 2 Drawing Sheets

METHOD OF MAKING III/V SEMICONDUCTOR LASERS

FIELD OF THE INVENTION

This invention pertains to methods of making III/V semiconductor lasers, including cleaving a semiconductor wafer.

BACKGROUND OF THE INVENTION

III/V semiconductor lasers have an important technological role (e.g., in optical fiber communications, medical equipment, CD players), and further growth of the use of such lasers can be confidently anticipated.

In view of the wide use of III/V semiconductor lasers, it would clearly be highly advantageous to be able to manufacture the lasers with high yield, since any yield improvement can translate essentially directly into cost reduction. This application discloses a cleaving technique that can substantially increase the number of acceptable lasers that can be obtained from a given multilayer III/V semiconductor wafer. The novel technique is particularly advantageous in conjunction with vacuum cleaving and in situ facet passivation.

In semiconductor laser manufacture it is conventional to separate a completed wafer into a multiplicity of "bars" by a process that involves marking the cleavage plane with a scribe mark near the wafer edge, and causing fracture along the plane selected by the scribe mark by application of appropriate force. The thus created cleavage surfaces define the optical cavity of the lasers and should be of the highest quality. For obvious reasons, there should be minimal variation of cavity length from bar to bar. In practice a significant fraction of conventionally vacuum-cleaved surfaces have defects (e.g., striations), and/or are misplaced and thus do not yield lasers of the desired cavity length. Such cleavage errors are less of a problem if cleaving can be carried out in air, since commercially available cleaving apparatus can yield acceptable cleaving results. Cleaving in air however frequently results in chemical contamination of the cleavage surfaces and therefore is frequently undesirable.

After cleaving of the wafer into bars, a given (acceptable) bar is separated into individual lasers, and the lasers are then typically tested and packaged.

U.S. Pat. No. 4,237,601 discloses separating a wafer with thick substrate into bars by a process that involves etching deep channels into the back surface of the substrate of the multilayer wafer, followed by mechanical cleaving along the channels.

U.S. Pat. No. 4,689,125 discloses forming individual short laser chips by a process that involves electrochemically photoetching intersecting grooves into the back surface of the substrate, and cleaving along the grooves.

The prior art techniques have significant shortcomings and have, to the best of our knowledge, not been used in commercial laser production. For instance, both techniques involve etching continuous grooves into the wafer surface that is opposite to the surface that carries the features (e.g., patterned metalization) that define the location of individual lasers on the wafer. Alignment of the grooves to the features on the opposite surface is at best difficult and inconvenient.

In view of the importance of III/V semiconductor lasers, a method of making the lasers that includes a reliable and accurate cleaving technique, capable of implementation in vacuum, and capable of making with high yield lasers having essentially uniform cavity length, with mirror facets free from striations or other mechanical damage, would be highly desirable. This application discloses such a method.

SUMMARY OF THE INVENTION

In a broad aspect the invention is embodied in a novel and advantageous method of making III/V semiconductor lasers that inter alia can lead to improved manufacturing yield of such lasers, exemplarily of InGaAs/AlGaAs/GaAs strained quantum well lasers useful as pump lasers for Er-doped optical fiber amplifiers.

More specifically, the invention is embodied in a method of making III/V semiconductor lasers that comprises making a body by forming on a major surface of a III/V semiconductor substrate a III/V semiconductor multilayer structure, and forming a patterned metal layer on the top surface of the semiconductor multilayer structure. The top surface includes a multiplicity of parallel contact regions, and the multilayer structure includes an active layer, with the contact regions defining active regions of the active layer in conventional fashion. The patterned metal layer comprises a multiplicity of spaced apart metal contact pads, with a given of said contact pads being disposed on a contact region. The method also comprises separating the body, made as described above, into a multiplicity of laser chips by a process that comprises cleaving the body such that a bar-shaped intermediate body (the "bar") is formed, and separating the bar into the laser chips. As will be appreciated, the cleavage planes of a given bar define the optical cavities of the laser chips made from the bar.

Significantly, separating the body comprises forming (typically by conventional photolithography and anisotropic etching) spaced apart, elongate depressions in the top surface of the semiconductor multilayer structure. The depressions are disposed such that a multiplicity of the depressions is aligned along a predetermined line in the top surface of the semiconductor multilayer structure, with the line being essentially at right angle to the contact regions and defining a cleavage plane of the body. Note that the above referred-to "line" is a geometrical line and not a physical feature in or on the surface. The depressions are spaced apart from the contact regions. Separating the body also comprises applying a force to the body such that the body cleaves along the cleavage plane defined by the multiplicity of depressions.

It will be appreciated that typically a wafer comprises a multiplicity of parallel sets of aligned depressions, with each set defining a cleavage plane. The spacing between sets determines the width of the laser bar, and thus determines the cavity length of the lasers. Since the depressions can be shaped and located with great precision by conventional photolithography and etching techniques, it is possible to repeatably produce lasers of essentially identical cavity lengths.

Since the depressions can readily be produced to have sharp features pointing outward in the longitudinal direction, the presence of the depressions facilitates initiation of cleavage. However, in order to get the full benefit of the novel cleaving technique, it is generally necessary to further facilitate cleavage along the predetermined plane, exemplarily by provision of a short scribe mark extending from a depression, typically from a depression located at or near the perimeter of the wafer. Optionally, etched features that facilitate cleavage of the laser bar into individual laser chips can also be provided.

DETAILED DESCRIPTION

A variety of III/V semiconductor (including InP-based as well as GaAs-based) lasers are known. The inventive method can be advantageously used in the production of any III/V semiconductor laser that comprises cleaved laser facets. The description below will be in terms of a particular III/V semiconductor laser, namely, an InGaAs/AlGaAsdGaAs strained quantum well laser. This is for the sake of concreteness, and no limitation is implied thereby.

The structure of the above-recited lasers is well known (see, for instance, N. Chand et al., *IEEE J. Quantum Electronics*, Vol. 30(2), pp. 424–440 (1994) as is a method of forming the multilayer semiconductor structure on the GaAs substrate, and of providing the n-side and p-side contacts.

Figure 1:
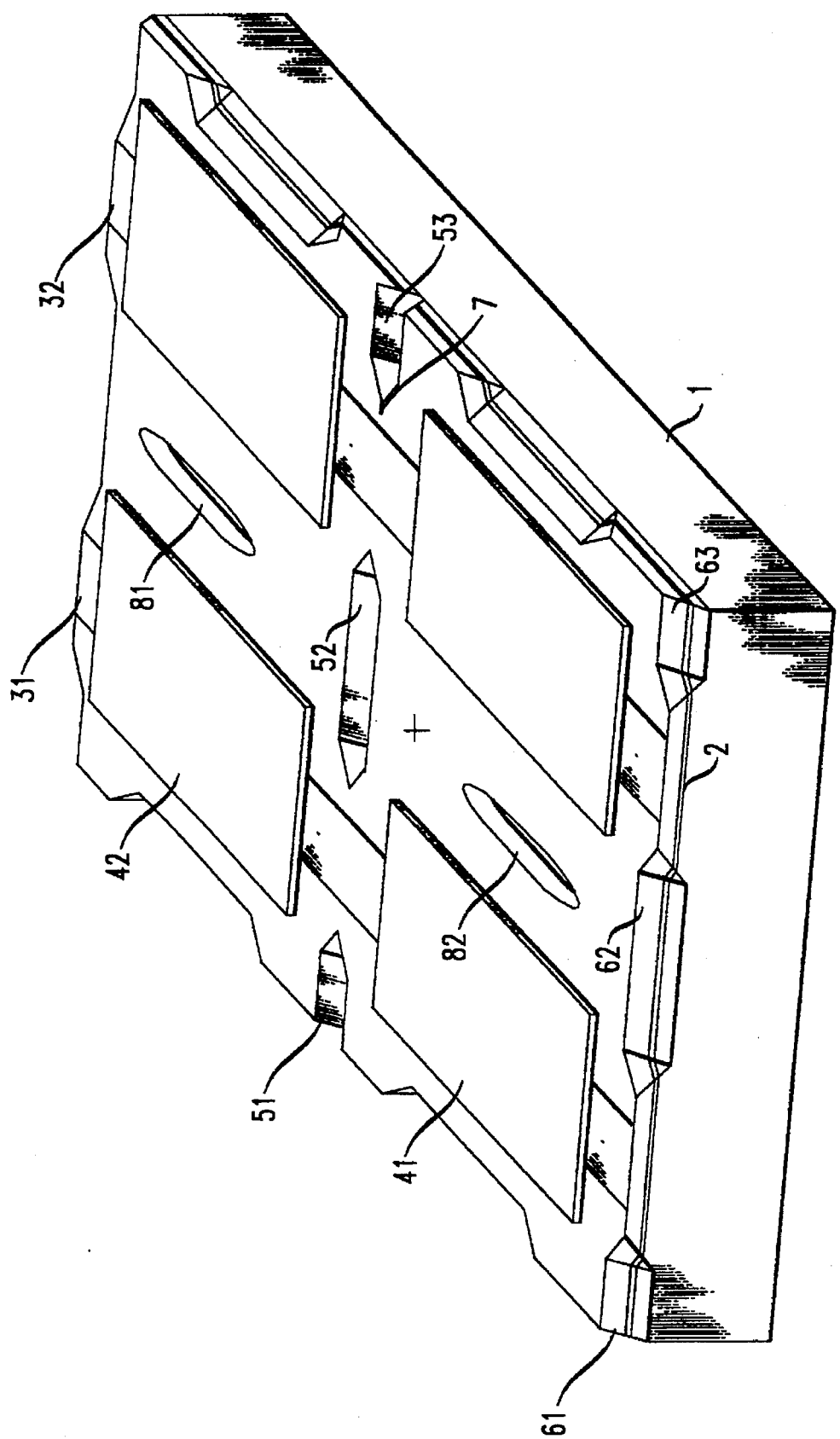
FIG. 1 schematically shows a portion of a laser wafer with depressions according to the invention.

FIG. 1 schematically depicts a portion of a III/V wafer with a conventional semiconductor multilayer structure thereon. Numeral 1 refers to the substrate, 2 refers to a specific layer of the multilayer structure (namely, the active layer; note that other layers of the multilayer structure are not shown separately), and 31 and 32 refer to two adjacent contact regions (exemplarily p-side contacts). The lateral extent of a given contact region substantially defines the lateral extent of the active region of the laser, and thus also defines the most critical portion of the laser facet. Numerals 41 and 42 designate two contact metal (typically Au) pads respectively overlying portions of contact region 31. Numerals 51–53 designate one set of aligned depressions in the top surface of the semiconductor multilayer structure, and numerals 61–63 refer to another set of such depressions. As can be seen, the members of a given set are aligned such that they lie on a straight line. Significantly, the depressions do not extend into the active regions (as defined by the lateral extent of the contact regions), thereby facilitating attainment of high quality facets in the active region.

Numeral 7 refers to a feature that further facilitates initiation of cleavage, and which we have found necessary in order to attain the highest quality cleavage. Exemplarily the feature is a mechanical scribe mark. As those skilled in the art will readily appreciate, precise positioning of the scribe mark is facilitated by the sharply pointed end of depression 53. Exemplarily, a scribe stylus is moved along the crease of depression 53 until the pointed end of the depression is reached. The thus positioned scribe is then moved a further small distance, with appropriate load applied, such that the scribe mark results. As shown in FIG. 1, scribe mark 7 also does not extend into contact region 32.

Numerals 81 and 82 refer to (optional) features in the top surface of the semiconductor multilayer structure. The features are provided to facilitate separation of laser bars into individual laser chips. Note that the portion of the wafer between depression sets 61–63 and 51–53 corresponds to a laser bar. Optional features 81, 82, etc. will typically also be formed by photolithography and etching, although shape and placement requirements are less critical than they are for depressions 51–53, etc.

Figure 2:
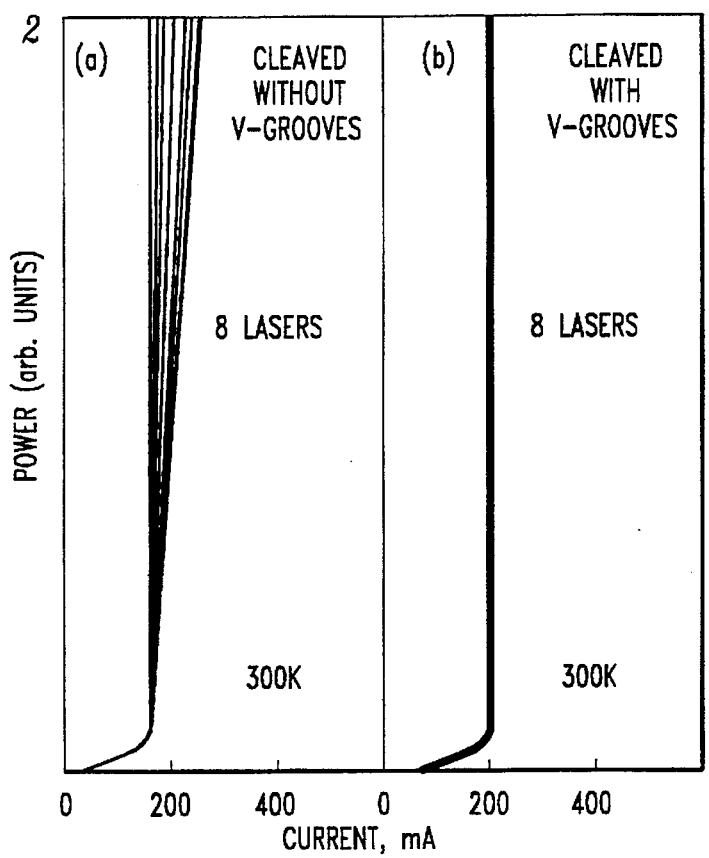
FIG. 2 shows exemplary performance data for 8 lasers produced according to the invention, and analogous 8 lasers that were cleaved in conventional fashion.

FIG. 2a shows the pulsed power vs. current (L-I) curves of 8 exemplary lasers that were cleaved and coated in vacuum in conventional fashion, without etched depressions, and FIG. 2b shows the corresponding pulsed L-I curves of 8 (otherwise identical) lasers that were cleaved in vacuum with etched depressions according to the invention, and coated in the same manner as the comparison lasers. The lasers according to the invention exhibited a very narrow spread of their L-I characteristics, as compared to the rather wide spread of the prior art lasers. FIG. 2 thus demonstrates advantageous results obtained with the inventive method of making lasers.

Figure 3:
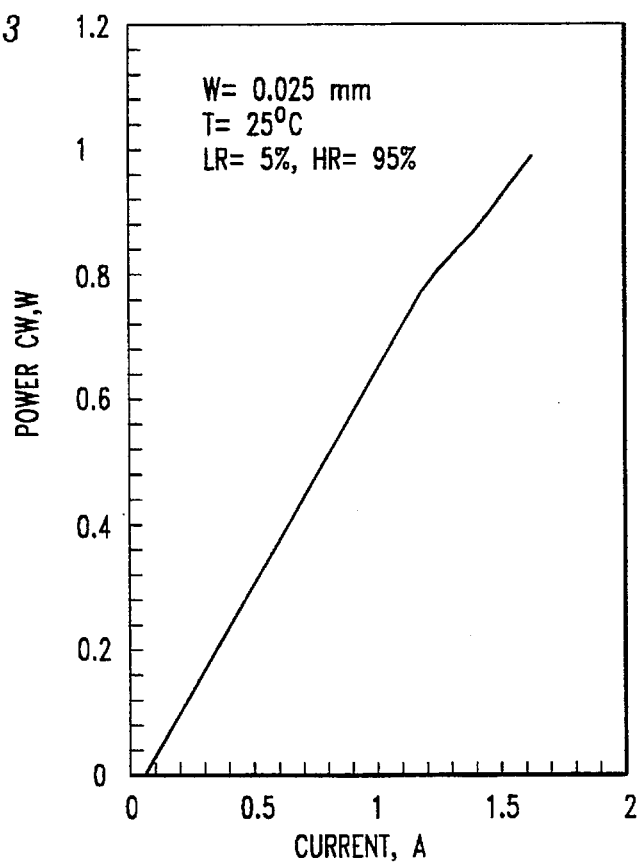
FIG. 3 shows data on light output vs. current for an exemplary laser produced according to the invention.

FIG. 3 shows the CW (continuous wave) L-I characteristics of an exemplary broad area stripe laser produced according to the invention. Output up to 1W was obtained despite an unoptimized heat sink and large thermal resistance.

The optical power density at the facet of the laser of FIG. 3 was 14.5 MW/cm$^2$ which, to our knowledge, is higher than the highest previously reported power density for broad area lasers. We attribute our excellent results to the high quality of the laser facets that result from our novel manufacturing technique, and the consequently high resistance to COD (catastrophic optical damage).

EXAMPLE

A laser structure was grown by MBE on a n-GaAs substrate wafer. The structure comprised an active layer with two 8 nm thick $In_{0.2}Ga_{0.8}As$ strained quantum wells separated by 10 nm thick GaAs spacer layers, and 1.5 μm thick Si- and Be-doped AlGaAs n- and p-cladding layers, respectively, on either side of the active layer. Graded composition layers were disposed between the active layer and the cladding layers, where the Al cell temperature was linearly graded from AlAs content of 0.4 to 0.05 or vice-versa over a thickness of 0.12 μm. Thick gold n-side contact pads were deposited in conventional fashion. Broad area lasers with active region stripe widths of 25 μm were fabricated by vacuum cleaving of 750 μm wide laser bars, followed immediately by ZnSe passivation of the cleaved surfaces, and SiO (R=5%) low reflectivity, and SiO/Si (R=90%) high reflectivity coating. Vacuum cleaving was done with and without depressions (V-grooves) according to the invention. V-grooves (about 20 μm wide and about 200 μm long, with 15 μm depth) were produced by conventional photolithography, followed by chemical etching in $3H_3PO_4:1H_2O_2:5H_2O$. Mechanical scribe marks were made. Microscopic inspection of facets produced by in-vacuum cleaving according to the invention showed no striations or hackles on the facets, contrary to what was observed when conventional cleaving was used.

Thus produced lasers were tested in conventional fashion. FIGS. 2 and 3 show exemplary results. Laser production according to the invention (including vacuum cleaving and in situ facet coating) had significantly higher yield than was obtained when prior art vacuum cleaving and coating was used.

The invention claimed is:

1. Method of making a III/V semiconductor laser comprising
   a) providing a III/V semiconductor substrate body having a major surface, and forming on the major surface a III/V semiconductor multilayer structure having a top surface including a multiplicity of parallel contact regions, the semiconductor multilayer structure including an active layer, with the contact regions substantially defining active regions of the active layer;
   b) forming a patterned metal layer on the top surface of the semiconductor multilayer structure, said patterned metal layer comprising a multiplicity of spaced apart metal contact pads, a given of said metal contact pads being disposed on a contact region; and
   c) separating a body made by steps a) and b) into a multiplicity of laser chips by a process that comprises cleaving said body such that a bar-shaped intermediate body is formed, said intermediate body having a laser cavity-defining cleavage surface, and separating said intermediate body into said laser chips;

CHARACTERIZED IN THAT step c) comprises forming the intermediate body a process that comprises d) forming elongate, spaced-apart depressions in the top surface of the semiconductor multilayer structure, said depressions disposed such that i) a first multiplicity of said depressions is essentially aligned along a first predetermined line in the top surface of the semiconductor multilayer structure, said first predetermined line being essentially at right angle to said contact regions and defining the cleavage surface of the intermediate body;

ii) the depressions of the first multiplicity of depressions are spaced from said contact regions; and step c) further comprises e) providing at least one surface feature adapted for facilitating cleavage along the first predetermined line; and f) applying a force to the body such that the body cleaves along said first predetermined line, and the intermediate body is formed.

2. Method of claim 1, wherein the substrate body is a GaAs substrate body.

3. Method of claim 2, wherein said first predetermined line is parallel to a <100> crystal direction of the GaAs substrate body.

4. Method of claim 1, wherein said elongate, spaced apart depressions are formed by a process that comprises photolithography and etching.

5. Method of claim 1, wherein step f) is carried out in a vacuum chamber, and wherein the method further comprises in situ deposition of a passivation layer on the cleavage surface.

6. Method of claim 1, wherein said surface feature is a scribe mark produced by contactingly moving a scribe stylus over the top surface.

7. Method of claim 1, wherein said at least one surface feature extends from a pointed end of a depression aligned along the first predetermined line.

8. Method of claim 7, wherein said surface feature is a scribe mark produced by moving a scribe stylus over said top surface such that the scribe mark is spaced from the contact regions.

* * * * *